(12) United States Patent
Lee et al.

(10) Patent No.: US 7,338,871 B2
(45) Date of Patent: Mar. 4, 2008

(54) METHOD FOR FABRICATING SEMICONDUCTOR DEVICE

(75) Inventors: Joo-Wan Lee, Kyoungki-do (KR);
Jun-Ki Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/020,494

(22) Filed: Dec. 21, 2004

(65) Prior Publication Data

US 2005/0287799 A1  Dec. 29, 2005

(30) Foreign Application Priority Data

Jun. 25, 2004 (KR) .................. 10-2004-0048368

(51) Int. Cl.
*H01L 21/336* (2006.01)
(52) U.S. Cl. ............... 438/299; 438/301; 438/305; 438/306; 257/E21.641
(58) Field of Classification Search ........... 438/287, 438/299, 653, 655, 675, 253, 254, 290, 300, 438/301, 303–307; 257/E21.641
See application file for complete search history.

(56) References Cited

U.S. PATENT DOCUMENTS

| 6,271,132 | B1 * | 8/2001 | Xiang et al. ............... 438/682 |
| 6,376,368 | B1 * | 4/2002 | Jung et al. ................. 438/639 |
| 6,440,828 | B1 * | 8/2002 | Sato et al. ................. 438/533 |
| 6,528,835 | B1 * | 3/2003 | Kaeriyama ................. 257/296 |
| 6,645,806 | B2 * | 11/2003 | Roberts ..................... 438/241 |
| 6,790,723 | B2 * | 9/2004 | Tanaka et al. ............. 438/243 |
| 6,864,506 | B2 * | 3/2005 | Kim et al. .................. 257/66 |
| 2002/0024119 | A1 | 2/2002 | Tanaka et al. |
| 2005/0239287 | A1 * | 10/2005 | Wang et al. ............... 438/682 |

FOREIGN PATENT DOCUMENTS

KR  10-2005-0009354  1/2005

* cited by examiner

*Primary Examiner*—Hsien-Ming Lee
(74) *Attorney, Agent, or Firm*—Blakely Sokoloff Taylor & Zafman

(57) ABSTRACT

The present invention provides a method for fabricating a semiconductor device capable of preventing a contact resistance from increasing in a region contacted to an N-type conductive region during forming a conductive pattern directly contacted to the N-type conductive region including a conductive pattern and silicon, and preventing an increase in a parasitic capacity of the conductive pattern according to an increase in a thickness of a barrier layer.

19 Claims, 3 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device capable of decreasing a contact resistance between a conductive region including silicon and a conductive pattern.

DESCRIPTION OF RELATED ARTS

A dynamic random access memory (DRAM) of a semiconductor memory device is divided into two regions. One is a cell region including a plurality of unit cells consisted of a transistor and a capacitor (1T1C) and the other is a peripheral region.

For instance, a bit line is a line practically transmitting data and is connected to a source of a cell transistor. As for the cell region, the bit line is electrically interconnected to a cell contact plug contacted to a source/drain junction region of a gate electrode through a bit line contact plug. As for the peripheral region including a bit line sense amplifier for sensing and amplifying the cell data transmitted through the bit line, an electrical interconnection between the bit line sense amplifier, i.e., more specifically a gate of the transistor forming the bit line sense amplifier and the source/drain junction, and the bit line is necessary.

FIG. 1 is a diagram illustrating a semiconductor device including a bit line directly contacted to a doping diffusion region of a substrate.

Referring to FIG. 1, a gate insulation layer 101, a gate conductive layer 102 and an insulation hard mask 103 are stacked on a substrate 100 and a gate electrode G provided with a spacer 104 and an etch stop layer 105 on the side is formed. Herein, there is a possibility both denotation numerals 104 and 105 indicate the spacer. Continuously, an impurity diffusion region 106 such as a source/drain junction enlarged from a surface of the substrate is formed by aligning itself with the side of the gate electrode. An insulation layer 107 is formed on the gate electrode G and the insulation layer 107 is etched, thereby forming an opening, i.e., a contact hole 108, exposing the impurity diffusion region 106. Along a profile formed with the opening 108, a barrier layer having a structure formed by stacking a titanium (Ti) layer 109 and a titanium nitride (TiN) layer 110 and 111 and a tungsten layer 112 is formed on the barrier layer. Accordingly, the tungsten layer 112 forms the bit line (B/L) electrically contacted to the impurity diffusion region 112 of the substrate 100 through the barrier layer.

A process forming compositions of FIG. 1 is briefly explained.

The insulation layer 107 is deposited on the provided gate electrode G and the insulation layer 107 is planarized through a chemical mechanical polishing (CMP) method or an etch back process. Thereafter, a photoresist pattern (not shown) is formed on the planarized insulation layer 107 and then, the opening 108 exposing the impurity diffusion region 106 is formed by etching the insulation layer 107 with use of the photoresist pattern as an etch mask.

Subsequently, along a profile formed with the opening 108, the Ti layer 109 and the TiN layer 110 are sequentially deposited. Then, a reaction between the impurity diffusion region 106 and the Ti layer 109 is induced by performing a thermal process and thereby, forming a titanium silicide ($TiSi_2$) layer (not shown) at an interface of the above two layers.

During a formation of a subsequent tungsten layer 112 after forming the $TiSi_2$ layer, the TiN layer 111 which is an additional barrier layer is formed to prevent a diffusion of tungsten. At this time, the TiN layer 111 is formed by employing a chemical vapor deposition (CVD) method and the tungsten layer 112 is also formed by using the CVD method.

Subsequently, a mask pattern formed by stacking the photoresist pattern or a polysilicon hard mask and the photoresist pattern is formed on the tungsten layer 112. Afterwards, the tungsten layer 112 and the barrier layer are selectively etched by using the mask pattern, thereby forming the bit line.

As for forming a bit line contact of a semiconductor device, an additional ion implantation is performed in a bit line contact region contacted to a P-type impurity diffusion region in order to raise a doping concentration of boron (B) around the contact. However, an Arsenic (As) or a phosphorus (Ph) ion implantation is not necessary in the bit line contact region contacted to an N-type impurity diffusion region.

Accordingly, as for a high integrated device with a size of less than approximately 800 Å, a current capacity is decreased by an increase in a resistance of an N-channel metal-oxide semiconductor (NMOS) transistor and thus, an operating speed of the device becomes slow. Meanwhile, as for a formation of the barrier layer, i.e., a diffusion barrier layer, in a contact region, in accordance with the prior arts, the Ti layer and the TiN layer are deposited by a physical vapor deposition (PVD) method, thereby forming $TiSi_2$. At this time, the barrier layer is hardly formed on a sidewall of the contact due to the PVD method and thus, the TiN layer is additionally deposited by the CVD method to cover the sidewall of the contact. Accordingly, a thick barrier layer with a thickness ranging from approximately 500 Å to approximately 600 Å is formed under the tungsten layer forming the bit line, thereby raising a height of a whole bit line. Therefore, a parasitic capacity of the bit line increases, thereby degrading an operating characteristic of the device.

SUMMARY OF THE INVENTION

It is, therefore, an object of the present invention to provide a method for fabricating a semiconductor device capable of preventing a contact resistance from increasing in a region contacted to an N-type conductive region during forming a conductive pattern directly contacted to the N-type conductive region including a conductive pattern and silicon, and preventing an increase in a parasitic capacity of the conductive pattern according to an increase in a thickness of a barrier layer.

In accordance with one aspect of the present invention, there is provided a method for fabricating a semiconductor device, including the steps of: forming an N-type highly doping region by doping N-type impurities on an N-type conductive region including silicon; depositing a first metal layer on the N-type doping region by using a chemical vapor deposition method, wherein a metal silicide is formed at an interface between the N-type doping region and the first metal layer by reacting metals of the first metal layer with the silicon of the N-type doping region; forming a conductive layer on the first metal layer; and forming a conductive pattern by selectively etching the conductive layer and the first metal layer.

In accordance with another aspect of the present invention, there is provided a method for fabricating a semiconductor device, including the steps of: forming an N-type highly doping diffusion region on a substrate; forming an N-type highly doping region by additional doping N-type impurities into the N-type doping diffusion region; depositing a first metal layer as a barrier on the N-type doping region by using a chemical vapor deposition method, wherein a metal silicide is formed at an interface between the N-type doping region and the first metal layer by reacting metals of the first metal layer with the silicon of the N-type doping region; forming a conductive layer on the first metal layer; and forming a conductive pattern by selectively etching the conductive layer and the first metal layer.

In accordance with further aspect of the present invention, there is provided a method for fabricating a semiconductor device, including the steps of: forming an insulation layer on a lower structure provided with an N-type conductive region including silicon; forming an opening to expose the N-type conductive region by selectively etching the insulation layer; forming an N-type highly doping region by doping N-type impurities on the N-type conductive region exposed by the opening; depositing a first metal layer as a barrier on the N-type doping region by using a chemical vapor deposition method, wherein a metal silicide is formed at an interface between the N-type doping region and the first metal layer by reacting metals of the first metal layer with the silicon of the N-type doping region; forming a conductive layer on the first metal layer; and forming a conductive pattern by selectively etching the first metal layer and the conductive layer.

In accordance with still further aspect of the present invention, there is provided a method for fabricating a semiconductor device, including the steps of: forming an N-type doping diffusion region on a substrate; forming an insulation layer on a lower structure provided with an N-type conductive region including silicon; selectively etching the insulation layer, thereby forming an opening to expose the N-type conductive region; forming an N-type highly doping region by doping N-type impurities on the N-type conductive region exposed by the opening; depositing a first metal layer as a barrier by using a chemical vapor deposition method on the N-type highly doping region, wherein a metal silicide is formed at an interface between the N-type highly doping region and the first metal layer by reacting metals of the first metal layer with the silicon of the N-type highly doping region; forming a conductive layer on the first metal layer; and forming a conductive pattern by selectively etching the first metal layer and the conductive layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 2A to 2E are cross-sectional views illustrating a process for forming a bit line in accordance with the present invention.

Hereinafter, with reference to FIGS. 2A to 2E, the present invention is explained as exemplifying the process for forming the bit line.

Figure 1:
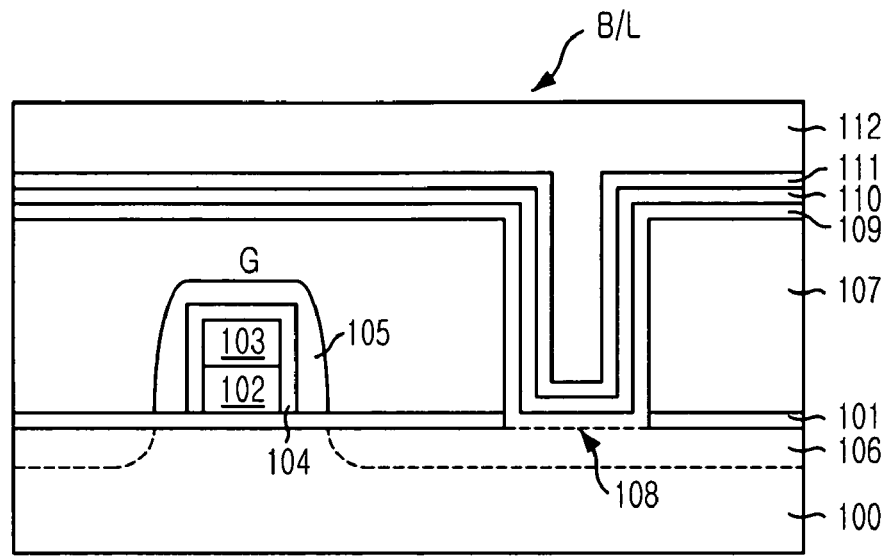
FIG. 1 is a cross-sectional view illustrating a semiconductor device including a bit line directly contacted to an impurity diffusion region of a substrate.
Figure 2A:
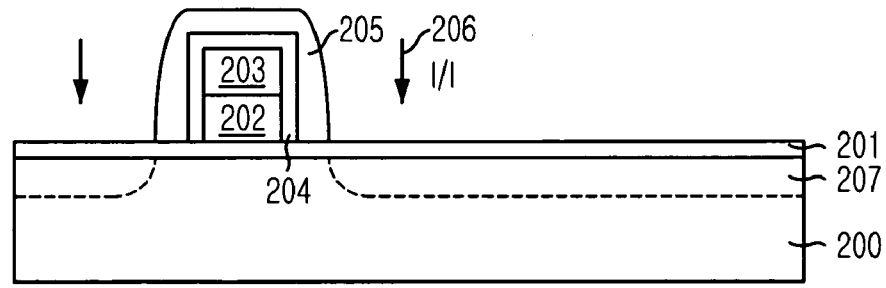
FIGS. 2A to 2E are cross-sectional views illustrating a process for forming a bit line in accordance with the present invention.

Referring to FIG. 2A, a gate insulation layer 201 is formed on a substrate 200 provided with various elements for forming a semiconductor device. The gate insulation layer 201 uses an oxide-based insulation layer. Herein, the substrate 200 is a typical silicon substrate.

A conductive layer and an insulation layer for a hard mask are sequentially deposited on the gate insulation layer 201 and then, a mask pattern for a gate electrode pattern formation is formed through a photolithography process. Thereafter, the conductive layer and the insulation layer for the hard mask are etched by using the mask pattern as an etch mask, thereby forming a gate electrode having a structure formed by stacking a gate conductive layer 202 and a hard mask 203.

The gate conductive layer 202 is made of a material selected from a group of polysilicon, tungsten, tungsten silicide, titanium and titanium nitride or a combination of the above listed materials. The gate hard mask 203 is made of a nitride layer based or an oxide-based insulation layer.

Subsequently, the insulation layer made of the nitride layer and the oxide layer or a combination of the nitride layer and the oxide layer is deposited along a profile formed with the gate electrode structure. Then, an etch back process is performed, thereby forming a spacer 204. The spacer 204 serves a role of preventing the gate electrode from an attack caused by a subsequent etching process. Next, an etch stop layer 205 is formed on the spacer 204.

The etch stop layer 205 serves a role of an etch stop during the etching process such as a self aligned contact (SAC) process and is made of an nitride based layer.

Herein, the etch stop layer can be considered as a double structure of the spacer.

Subsequently, an ion implantation process 206 is employed and then, N-type impurities are doped on the substrate 200 to align themselves with the side of the gate electrode. Afterwards, doped impurities are diffused through a thermal process, thereby forming an N-type doping diffusion region 207 such as a source/drain junction.

At this time, Arsenic (As) is used as the N-type impurities and a concentration of As ranges from approximately $2 \times 10^{15}$ atoms/cm$^2$ to approximately $5 \times 10^{15}$ atoms/cm$^2$. Also, an ion implantation needs an energy ranging from approximately 12 KeV to approximately 18 KeV.

Figure 2B:
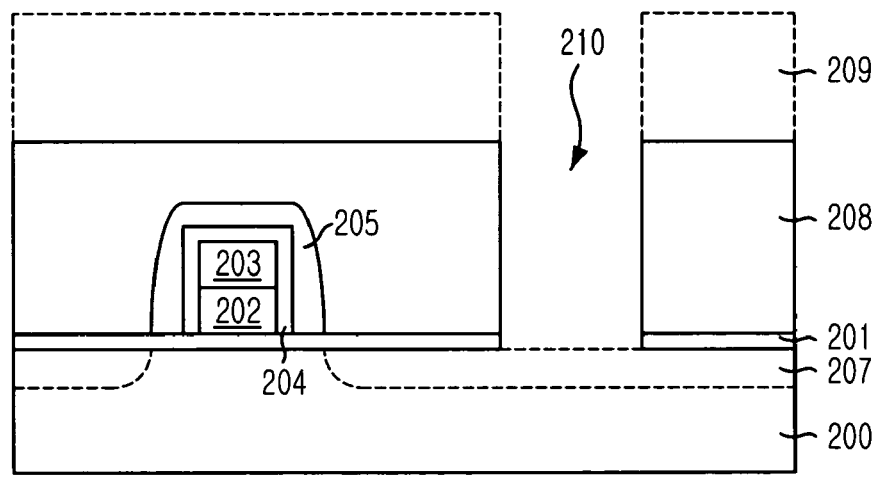

Referring to FIG. 2B, an insulation layer 208 is formed on the gate insulation layer 201 and the etch stop layer 205. The insulation layer 208 is made of an oxide-based insulation layer, or an organic or inorganic based low permittivity layer.

The oxide-based insulation layer is formed by employing a material selected from a group consisting of a boro-silicate-glass (BSG) layer, a boro-phospho-silicate-glass (BPSG) layer, a phosphor-silicate-glass (PSG) layer, a tetra-ethyl-ortho-silicate (TEOS) layer, a high-density-plasma (HDP) oxide layer, a spin-on-glass (SOG) layer and an advanced planarization layer (APL) or a combination thereof.

Meanwhile, a low pressure-tetra-ethyl-ortho-silicate (LP-TEOS) layer is exemplified in accordance with the present invention and a depositing thickness of the LP-TEOS ranges from approximately 1,200 Å to approximately 2,000 Å.

Subsequently, an upper portion of the insulation layer 208 is planarized by using a chemical mechanical polishing (CMP) method and an etch back process in order to secure a margin during a subsequent photolithography process.

Next, a photoresist pattern 209 is formed on a planarized insulation layer 208. Then, the insulation layer 208 is etched by using the photoresist pattern 209 as an etch mask, thereby forming an opening 210 exposing the N-type doping diffusion region 207 where a bit line contact will be formed.

Next, the photoresist pattern 209 is removed by performing a photoresist strip process. At this time, in case of using only the photoresist pattern 209 as a mask pattern, the photoresist pattern 209 should have an enough thickness raging from approximately 2,500 Å to approximately 3,500 Å to perform a role of the barrier layer when etching.

Meanwhile, although the preferred embodiment of the present invention exemplifies a case that the photoresist pattern 209 is exclusively used as a mask pattern, a sacrifice hard mask can be used under the photoresist 209 in order to cover a thickness degradation of the photoresist pattern 209 according to a high resolution and a characteristic of the etch barrier layer caused by the thickness degradation of the photoresist. The sacrifice hard mask can be formed by mainly using a nitride layer, a tungsten layer and a polysilicon layer.

Figure 2C:
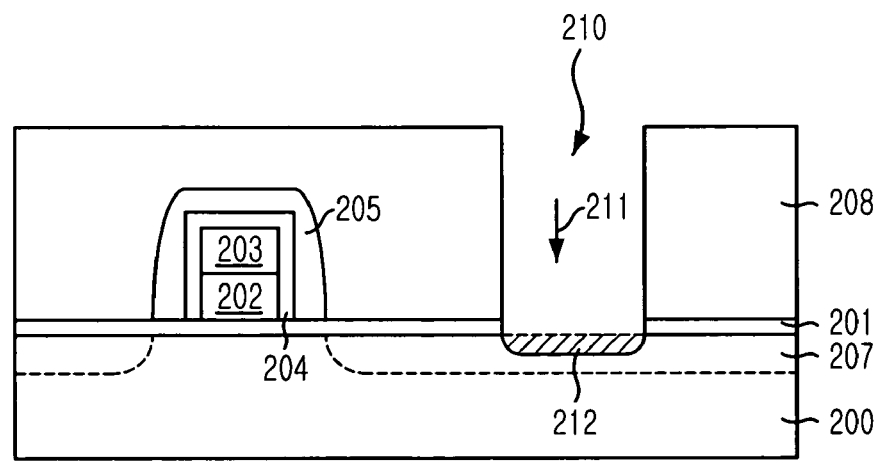

Subsequently, referring to FIG. 2C, the N-type impurities are ion implanted by performing an ion implantation 211 to the N-type doping diffusion region 207 exposed for the bit line contact according to the formation of the opening 210. Afterwards, an N-type highly doping diffusion region 212 is formed in the N-type doping diffusion region 207. Accordingly, a concentration of surplus electrons in a region where a subsequent bit line contact is formed increases.

At this time, As is used as the N-type impurities and a concentration of the As ranges from approximately $2 \times 10^{15}$ atoms/cm$^2$ to approximately $5 \times 10^{15}$ atoms/cm$^2$. Furthermore, the ion implantation uses energy ranging from approximately 7 KeV to approximately 12 KeV. Since an ion-implantation energy is low compared to the ion implantation energy used when forming the impurity diffusion region, the N-type highly doping diffusion region 212 is formed inside of the N-type doping diffusion region 207.

During a thermal process, a rapid thermal process is performed at a temperature ranging from approximately 750° C. to approximately 850° C. during a period ranging from approximately 20 seconds to approximately 40 seconds. Also, it is preferable to perform the thermal process in an atmosphere of $N_2$ or Ar.

Figure 2D:
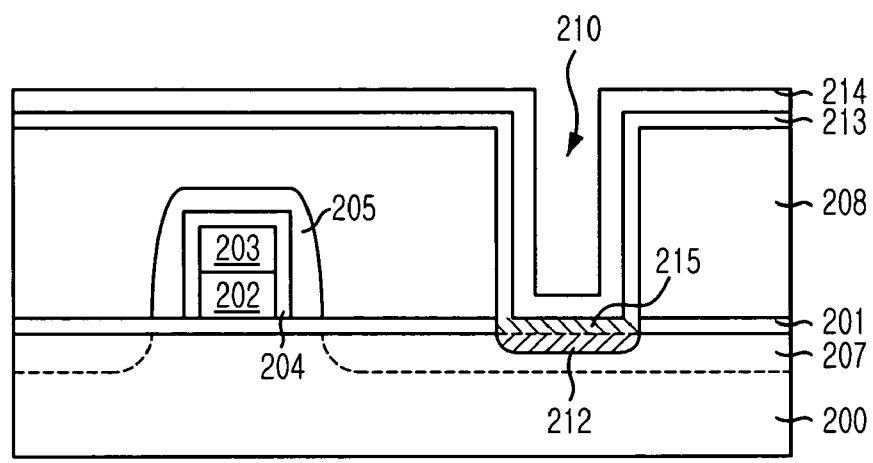

Next, referring to FIG. 2D, a titanium (Ti) layer 213 is deposited along a profile formed with the opening 210 by using a chemical vapor deposition (CVD) method. At this time, due to a characteristic of the CVD method, titanium of the Ti layer 213 and silicon of the N-type highly doping diffusion region 212 are reacted, thereby forming silicide $TiSi_2$ 215. Herein, it is preferable that a depositing temperature of $TiSi_2$ should be maintained at a temperature greater than approximately 690° C. for smoothly forming $TiSi_2$ 215. A depositing thickness of the Ti layer 213 ranges from approximately 5 Å to approximately 15 Å on the insulation layer and a depositing thickness of $TiSi_2$ ranges from approximately 40 Å to approximately 100 Å on the silicon substrate. When depositing the Ti layer 213, $TiCl_4$ and $H_2$ are used as a source gas.

Subsequently, a TiN layer 214 is formed along a profile formed with the Ti layer 213 by using the CVD method. At this time, a depositing thickness of the TiN layer 214 is very thin with a thickness ranging from approximately 100 Å to approximately 200 Å.

Hereby, a barrier layer having a structure of the TiN layer 214 and the Ti layer 213 and $TiSi_2$ 215 under the barrier layer for an omic contact are completed. Afterwards, an additional thermal process for improving a characteristic of the barrier layer can be performed. During the thermal process, a rapid thermal process is performed at a temperature ranging from approximately 750° C. to approximately 850° C. during a period ranging from approximately 20 seconds to approximately 40 seconds.

Meanwhile, although the preferred embodiment of the present invention exemplifies the barrier layer formed by stacking the TiN layer and the Ti layer, the barrier layer can be formed by using a metal layer with various types which has an excellent characteristic and makes it possible to form silicide by reacting with silicon such as Ta or TaN, or by staking the metal layer.

Figure 2E:
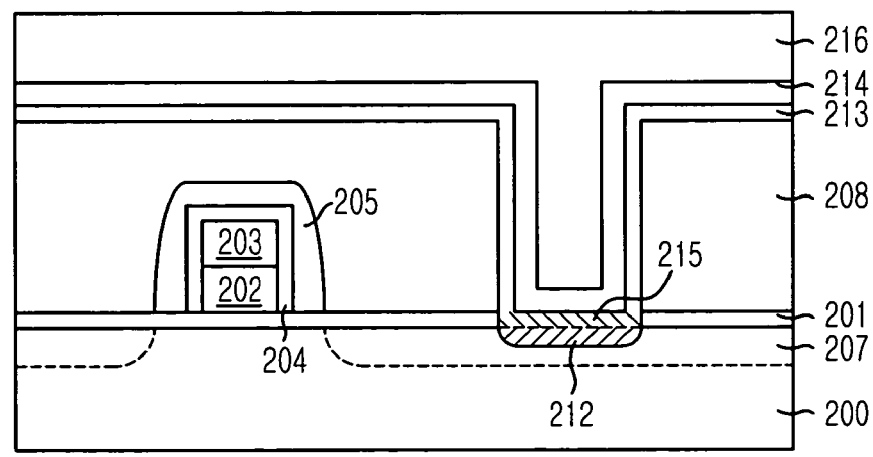

Subsequently, referring to FIG. 2E, a tungsten layer 216 which is the conductive layer for the bit line is formed on all sides formed with the barrier layer and then, the mask pattern formed by stacking the photoresist pattern or a polysilicon hard mask and the photoresist pattern is formed thereon. Afterwards, the tungsten layer 216 and the barrier layer are selectively etched by using the mask pattern, thereby forming the bit line.

Meanwhile, the bit line conductively layer can be formed by using a material selected from a group of a polysilicon layer, tungsten silicide, a tungsten nitride layer, a TiN layer, a Ta layer and a TaN layer or a combination of the above listed materials.

In case of depositing the tungsten layer 216 through the CVD method, $WF_6$ is deposited by restoring itself with use of $H_2$ and $SiH_4$ or $Si_2H_6$. A depositing thickness of the tungsten layer 216 ranges from approximately 500 Å to approximately 800 Å.

Although the preferred embodiment of the present invention exemplifies a process for forming the bit line, a process for forming all conductive layers directly contacted to an N-type conductive region including silicon such as a cell contact, a plug, a metal contact and a metal interconnection can be applied to the present invention.

As explained above, in accordance with the present invention, an N-type impurity, As, is additionally doped in the N-type conductive region including silicon contacted to a conductive pattern, thereby raising a concentration of impurities and lowering a contact resistance. Then, a first metal layer for a barrier such as a Ti layer is thinly deposited by a CVD method and simultaneously, silicon in a lower portion of an impurity diffusion region and a first metal layer are reacted by each other, thereby forming metal silicide such as $TiSi_2$. Again, a second metal layer for a barrier such as TiN layer is deposited through a CVD method and then, metal silicide such as $TiSi_2$ is formed. Therefore, it is possible to relatively lower a height of the barrier layer in the conductive pattern and to optimize a temperature and a thickness when depositing the first metal layer for the barrier, thereby obtaining a very low contact resistance.

Also, the present invention provides an effect of increasing an operating speed and a current capacity since a contact resistance can be lowered approximately 25% by doping N-type additional impurities.

Furthermore, by depositing the barrier layer through the CVD method, it is possible to lower the thickness of the conductive layer most significantly, thereby decreasing the parasitic capacity of the conductive pattern. Accordingly, that is, in case of the conductive pattern of a device is the bit line, there is an effect of improving a characteristic such as refresh of the semiconductor memory device.

The present application contains subject matter related to the Korean patent application No. KR 2004-0048368, filed in the Korean Patent Office on Jun. 25, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming a gate electrode over a substrate;
   forming an N-type doping region in the substrate by a first ion implantation process;
   depositing an insulating layer over the gate electrode and the N-type doping region;
   forming an opening to expose a partial portion of the N-type doping region where a conductive pattern will be formed;
   forming an N-type highly doping region in the partial portion of the N-type doping region, after forming the opening, by a second ion implantation process;
   depositing a first metal layer over the N-type highly doping region by using a chemical vapor deposition method, wherein a metal silicide is formed between the N-type highly doping region and the first metal layer;
   forming a conductive layer over the first metal layer; and
   forming the conductive pattern by selectively etching the conductive layer and the first metal layer.

2. The method of claim 1, wherein the forming the N-type highly doping region further comprising a second thermal process after the second ion implantation process.

3. The method of claim 2, wherein the second ion implantion is performed by a concentration of arsenic (As) ranges from about $2\times10^{15}$ atoms/cm$^2$ to about $5\times10^{15}$ atoms/cm$^2$ and an ion implantation energy needs energy ranging from about 7 KeV to about 12 KeV.

4. The method of claim 2, wherein the first and second ion implantation process is performed by arsenic (As) ion.

5. The method of claim 4, wherein the second thermal process is performed by a rapid thermal process at a temperature ranging from about 750° C. to about 850° C. and for about 20 seconds to about 40 seconds.

6. The method of claim 5, wherein the second thermal process is performed in an atmosphere of nitrogen ($N_2$) or argon (Ar).

7. The method of claim 1, wherein the first metal layer is deposited at a temperature of at least 690° C.

8. The method of claim 1, wherein the first metal layer is formed on an insulation layer in a thickness ranging from about 5 Å to about 15 Å and the metal silicide is formed over the substrate in a thickness ranging from about 40 Å to about 100 Å.

9. The method of claim 1 further including the steps of:
   depositing a second metal layer for a barrier on the first metal layer; and
   performing a thermal process after the depositing the first metal layer.

10. The method of claim 9, wherein the second metal layer is formed with a thickness ranging from about 10 Å to about 20 Å.

11. The method of claim 9, wherein the thermal process is performed at a temperature ranging from about 750° C. to about 850° C. and for about 20 seconds to about 40 seconds.

12. The method of claim 9, wherein the first metal layer is a titanium (Ti) layer; the second metal layer is a titanium nitride (TiN) layer; and the metal silicide is titanium silicide ($TiSi_2$).

13. The method of claim 1, wherein the forming the N-type doping region further comprising a first thermal process after the first ion implantation process.

14. The method of claim 13, wherein the first ion implantation process is performed by a concentration of arsenic (As) ranges from about $2\times10^{15}$ atoms/cm$^2$ to about $5\times10^{15}$ atoms/cm$^2$ and an ion implantation energy needs energy ranging from about 12 KeV to about 18 KeV.

15. The method of claim 1, wherein the conductive layer includes a tungsten layer.

16. The method of claim 15, wherein the conductive layer is formed with a thickness ranging from about 500 Å to about 800 Å.

17. The method of claim 1, wherein a gate insulation layer is formed over the substrate before the forming the gate electrode.

18. The method of claim 1, wherein the gate electrode is covered by an etch stop layer.

19. The method of claim 1, wherein the metal silicide is formed by reacting a metal of the first metal layer with silicon of the N-type highly doping region through the chemical vapor deposition method.

* * * * *